(12) United States Patent
Lee et al.

(10) Patent No.: US 9,087,609 B2
(45) Date of Patent: Jul. 21, 2015

(54) MULTI-BIT MEMORY DEVICE (71) Applicant: Korea Advanced Institute of Science & Technology, Daejeon (KR)

(72) Inventors: Hee Chul Lee, Daejeon (KR); Woo Young Kim, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 47 days.

(21) Appl. No.: 14/014,087

(22) Filed: Aug. 29, 2013

(65) Prior Publication Data

US 2014/0376296 A1 Dec. 25, 2014

(30) Foreign Application Priority Data

Jun. 21, 2013 (KR) .......................... 10-2013-0071575

(51) Int. Cl.
*G11C 11/22* (2006.01)
*G11C 11/56* (2006.01)

(52) U.S. Cl.
CPC ............ *G11C 11/5657* (2013.01); *G11C 11/56* (2013.01)

(58) Field of Classification Search
USPC ........... 365/49.3, 65, 117, 145, 146, 149, 150
See application file for complete search history.

(56) References Cited

U.S. PATENT DOCUMENTS

| 2004/0174731 | A1 | 9/2004 | Saito et al. | |
|---|---|---|---|---|
| 2005/0013161 | A1 | 1/2005 | Matsumoto et al. | |
| 2007/0126042 | A1 | 6/2007 | Kijima et al. | |
| 2010/0019348 | A1* | 1/2010 | Nagai | 257/532 |
| 2010/0321857 | A1* | 12/2010 | Habu et al. | 361/281 |
| 2011/0149633 | A1* | 6/2011 | Ahn et al. | 365/145 |

FOREIGN PATENT DOCUMENTS

| JP | 2004-241632 A | 8/2004 |
|---|---|---|
| KR | 10-0236994 B1 | 1/2000 |
| KR | 10-2009-0105590 A | 10/2009 |

* cited by examiner

*Primary Examiner* — Fernando Hidalgo
(74) *Attorney, Agent, or Firm* — Foley & Lardner LLP (57) ABSTRACT Disclosed is a multi-bit memory device including: a first electrode; a third electrode which is disposed apart from the first electrode; a second electrode which is disposed between the first electrode and the third electrode; a first memory unit which is disposed between the first electrode and the second electrode and includes a material which is electrically polarized and exhibits hysteresis; and a second memory unit which is disposed between the second electrode and the third electrode and includes a material which is electrically polarized and exhibits hysteresis.

19 Claims, 6 Drawing Sheets

MULTI-BIT MEMORY DEVICE

CROSS-REFERENCE TO RELATED APPLICATION

The present application claims priority under 35 U.S.C. §119(e) of Korean Patent Application No. 10-2013-0071575 filed Jun. 21, 2013 the subject matters of which are incorporated herein by reference.

BACKGROUND

1. Field

Embodiments may relate to a multi-bit memory device.

2. Description of Related Art

A multi-bit memory device is capable of storing four logic states "00", "01", "10" and "11".

When a voltage is applied to a conventional multi-bit memory device, interference occurs due to the electric field in two or more memory units which are in contact with each other. Due to the interference, there was a case where the conventional multi-bit memory device did not output an accurate result value.

In particular, since the malfunction due to the interference is increased with the reduction of the size of the multi-bit memory device which generates the interference, there was a limit to reduce the size of the memory device. Therefore, since there was a limit to reduce the size of the conventional multi-bit memory device, it was difficult to improve the degree of integration of the memory device. Here, the degree of integration means the number of the devices included in a unit area or in one circuit.

To overcome such problem, research is required to develop a multi-bit memory device capable of not causing the interference and of normally operating with its reduced size.

SUMMARY

One aspect of the present invention is a multi-bit memory device. The multi-bit memory device includes: a first electrode; a third electrode which is disposed apart from the first electrode; a second electrode which is disposed between the first electrode and the third electrode; a first memory unit which is disposed between the first electrode and the second electrode and includes a material which is electrically polarized and exhibits hysteresis; and a second memory unit which is disposed between the second electrode and the third electrode and includes a material which is electrically polarized and exhibits hysteresis.

The multi-bit memory device may further include: a cell transistor which includes a source, a drain and a gate; a word line which is electrically connected to the gate; a bit line which is electrically connected to the drain; and a signal processor which is electrically connected to the bit line and includes a comparator and a multiplexer. The source may be electrically connected to the first electrode and the third electrode. When an operating voltage is applied to the second electrode, the cell transistor may be operated. When the first electrode and the third electrode are connected to the bit line, an electric potential of the bit line may change. The comparator may compare the electric potential with an initial electric potential of the bit line and outputs a comparison signal to the multiplexer. The multiplexer may determine logic states of the first memory unit and the second memory unit through the comparison signal.

Another aspect of the present invention is a multi-bit memory device. The multi-bit memory device includes: at least two first electrode lines which are parallel with each other; at least two second electrode lines which are parallel with each other and are disposed to intersect the first electrode line; at least two third electrode lines which are parallel with the first electrode line and are disposed to intersect the second electrode line; a first memory unit which is disposed between the first electrode line and the second electrode line and includes a material which is electrically polarized and exhibits hysteresis; and a second memory unit which is disposed between the second electrode line and the third electrode line and includes a material which is electrically polarized and exhibits hysteresis.

The second memory unit may include a plurality of memory units, each of which is disposed at an intersection point of the first electrode line, the second electrode line and the third electrode line.

The multi-bit memory device may further include low dielectric material filling between the plurality of the memory units. The low dielectric material may have a dielectric constant less than dielectric constants of the first memory unit and the second memory unit.

The first memory unit may be switched prior to the second memory unit.

Further another aspect of the present is a multi-bit memory device. The multi-bit memory device may include: a substrate; a first electrode which is disposed on the substrate; a first memory unit which is disposed on the substrate and the first electrode and includes a material which is electrically polarized and exhibits hysteresis; a semiconductor unit which is disposed on the first memory unit; a source electrode which is disposed on one side of the semiconductor unit; a drain electrode which is disposed on the other side of the semiconductor unit; a second memory unit which is disposed on the semiconductor unit and is located between the source electrode and the drain electrode and includes a material which is electrically polarized and exhibits hysteresis; and a second electrode which is disposed on the second memory unit.

When a first operating voltage is applied to the first electrode and a second operating voltage is not applied to the second electrode, a current $I_{D1}$ may flow through the semiconductor unit. When the first operating voltage is not applied to the first electrode and the second operating voltage is applied to the second electrode, a current $I_{D2}$ may flow through the semiconductor unit. The current $I_{D1}$ may be greater than the current $I_{D2}$.

The first memory unit and the second memory unit may comprise ferroelectrics or an electret material.

The area of the first memory unit may be different from the area of the second memory unit.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Prior to the description of the embodiments of the present invention, the basic principle of a multi-bit memory device of the present invention will be described.

Figure 1:
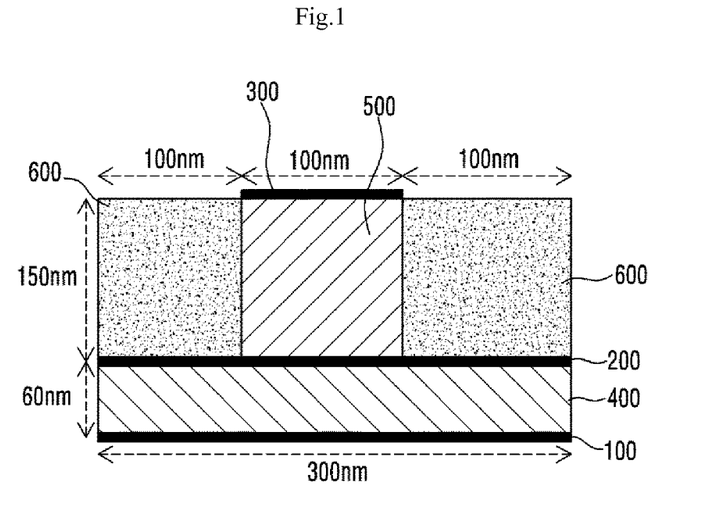
FIG. 1 is a cross sectional view of a multi-bit memory device according to the present invention.

FIG. 1 is a cross sectional view of a multi-bit memory device according to the present invention.

As shown in FIG. 1, the multi-bit memory device according to the present invention may include a first electrode 100, a second electrode 200, a third electrode 300, a first memory unit 400, a second memory unit 500 and low dielectric material 600.

First, the structure of the multi-bit memory device shown in FIG. 1 will be described. The first electrode 100 is disposed apart from the third electrode 300. The second electrode 200 is disposed between the first electrode 100 and the third electrode 300. The first memory unit 400 is disposed between the first electrode 100 and the second electrode 200. The second memory unit 500 is disposed between the second electrode 200 and the third electrode 300. The low dielectric material 600 is disposed on the second electrode 200 and is placed on both sides of the second memory unit 500.

The first electrode 100 and the third electrode 300 may be an anode, and the second electrode 200 may be a cathode. The first electrode 100 and the third electrode 300 are electrically connected to each other.

The first electrode 100, the second electrode 200 and the third electrode 300 may include at least one of metal, oxide conductor, oxide semiconductor, conducting polymer, organic semiconductor, inorganic semiconductor, carbon nanotube and its derivative, fullerene (C60) and its derivative, and graphene and its derivative.

The first memory unit 400 and the second memory unit 500 may include ferroelectrics or an electret material, each of which is electrically polarized and exhibits hysteresis in a characteristic curve showing a polarization-voltage, current-voltage or capacitance-voltage relationship. Here, the hysteresis is the dependence of a system not only on its current environment but also on its past environment. That is, the hysteresis means that the physical quantity of a certain substance is not determined only by physical conditions at that time and depends on the change of the past state of the substance prior to that time.

The ferroelectrics or electret material may include an inorganic matter such as $Pb(Zr,Ti)O_3$ (PZT), $SrBi_2Ta_2O_9$ (SBT), $BaMgF_4$, $Sr_2(Ta,Nb)_2O_7$ (STN) or the like and an organic matter such as polyvinylidene fluoride (PVDF), odd-numbered nylon, polyurea, polythiourea, polyurethane, polyvinylidene cyanide (PVCN), polyacrylonitrile (PAN) or the like. Also, the ferroelectrics or electret material may include a material obtained by adding a small amount of another element to the inorganic matter, a material obtained by adding the inorganic matter in the form of powder or nano particle to the organic matter, a copolymer based on the organic matter, and a material which is based on the organic matter and is mixed with polymer.

Here, it means that the addition of small amount occupies less than 50% of the total constituents and it means that the based organic matter occupies greater than 50% of the total constituents. Also, the first memory unit 400 and the second memory unit 500 may include mutually different materials.

The first memory unit 400 area switched by an electrical signal may be different from the second memory unit 500 area switched by an electrical signal. The first memory unit 400 may have an operating voltage range different from that of the second memory unit 500. Here, the operating voltage has a voltage level required for switching the polarization of the first memory unit 400 and the second memory unit 500. Since the switched area of the first memory unit 400 is different from the switched area of the second memory unit 500, when the switching occurs in the first memory unit 400 or in the second memory unit 500, it is possible to distinguish between the logic states "01" and "10". Further, since the first memory unit 400 has an operating voltage range different from that of the second memory unit 500, the first memory unit 400 and the second memory unit 500 show four logic states. The four logic states will be described with reference to FIGS. 2 and 3.

Specifically, a method of differentiating the switched polarization values of the first memory unit 400 and the second memory unit 500 is to differentiate the areas of the first memory unit 400 and the second memory unit 500 or to differentiate the constituents, manufacturing methods or thicknesses of the first memory unit 400 and the second memory unit 500.

The first memory unit 400 and the second memory unit 500 may be manufactured by at least one of a spin coating method, a spray method, a printing method, an ink jet method, Langmuir-Blodgett method, an evaporation method, a sputtering method, an atomic layer deposition (ALD) method, and a transferring method. Here, the first memory unit 400 and the second memory unit 500 may be manufactured in the same way or by different methods.

The low dielectric material 600 may have a low dielectric constant or may be filled with air.

The low dielectric material 600 includes an insulation material having a dielectric constant less than the dielectric constants of the first memory unit 400 and the second memory unit 500. Specifically, the low dielectric material 600 may be a silicon oxide with the addition of fluorine (SiOF), polytetra fluoroethylene (PTFE), polyimides resin, benzocyclobutene (BCB), organic spin on glass (SOG), hydrogen silsesquioxane (HSQ) and the like.

Hereafter, the operation of the multi-bit memory device of the present invention will be described.

Figure 2:
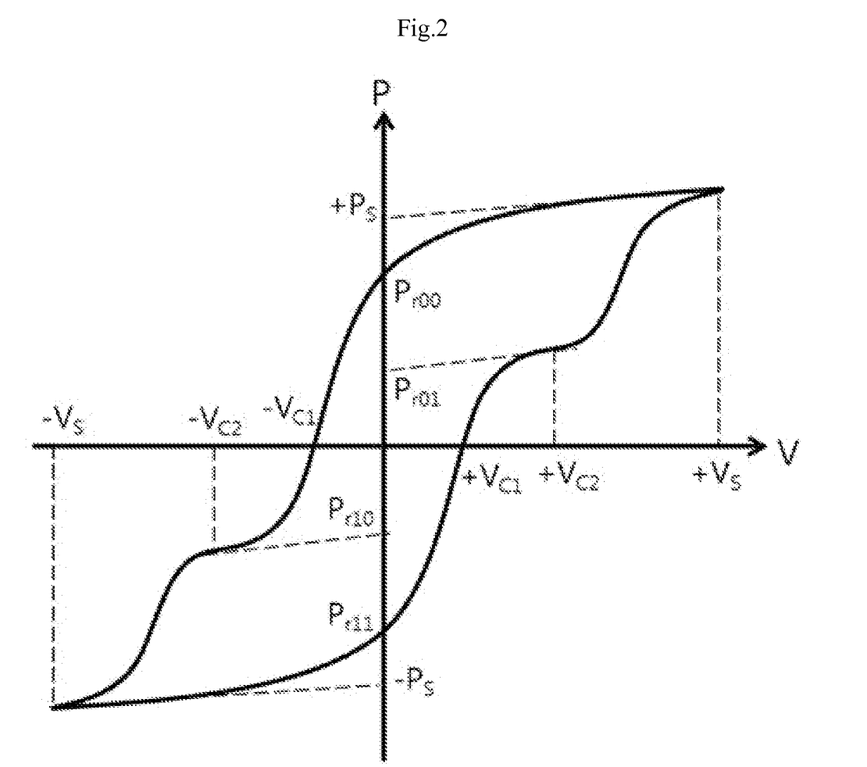
FIG. 2 is a polarization-voltage hysteretic curve of the multi-bit memory device according to the present invention.
Figure 3:
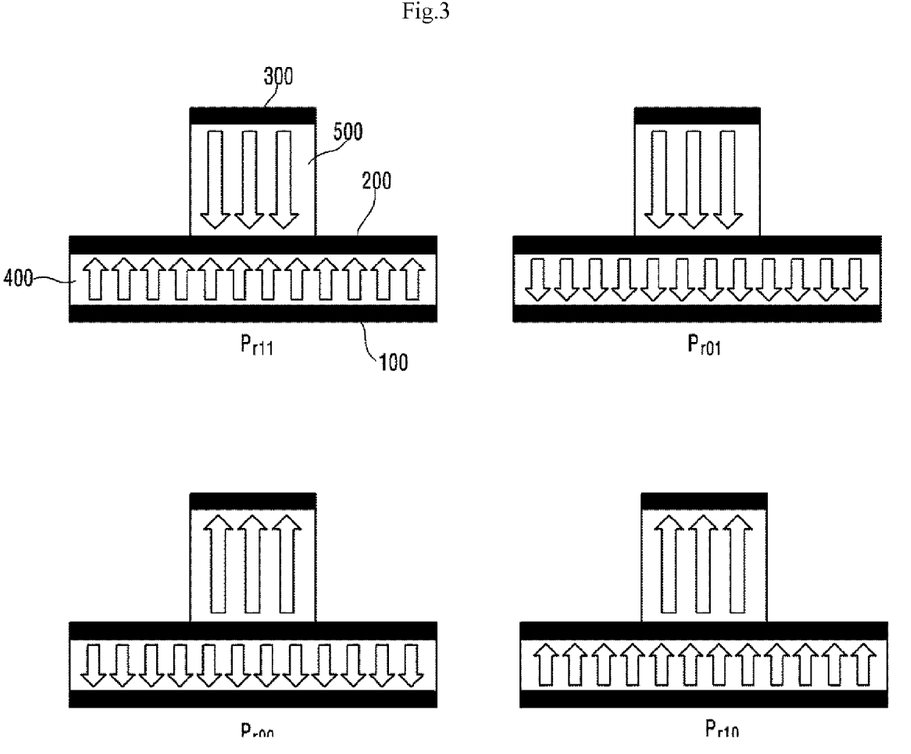
FIG. 3 is a conceptual view for describing the operation of the multi-bit memory device according to the present invention.

FIG. 2 is a polarization-voltage hysteretic curve of the multi-bit memory device according to the present invention. FIG. 3 is a conceptual view for describing the operation of the multi-bit memory device according to the present invention. Specifically, the horizontal axis of FIG. 2 represents the voltage V applied to the second electrode 200. The vertical axis of the FIG. 2 represents the polarizations P of the first memory unit 400 and the second memory unit 500.

The logic states "00", "01", "10" and "11" will be described with reference to FIGS. 2 and 3. When the voltage V applied to the second electrode 200 is $-V_S<V<-V_{C2}$, the dipoles of the first memory unit 400 and the second memory unit 500 face toward the second electrode 200. Accordingly, the first memory unit 400 and the second memory unit 500 become a state of a remnant polarization ($P_{r11}$), and the logic states of the first memory unit 400 and the second memory unit 500 may be "11".

When the voltage V applied to the second electrode 200 is $+V_{C1}<V<+V_{C2}$, the switching occurs in the first memory unit 400 and does not occur in the second memory unit 500. As a result, the dipole of the first memory unit 400 faces toward the first electrode 100, and the dipole of the second memory unit 500 faces toward the second electrode 200 as described above. Accordingly, the first memory unit 400 and the second memory unit 500 become a state of a remnant polarization ($P_{r01}$), and the logic states of the first memory unit 400 and the second memory unit 500 may be "01".

When the voltage V applied to the second electrode 200 is $+V_{C2}<V<+V_S$, because the switching has occurred in the first memory unit 400, an additional switching does not occur in the first memory unit 400, and the switching occurs in the second memory unit 500. As a result, the dipole of the first memory unit 400 faces toward the first electrode 100 as described above, and the dipole of the second memory unit 500 faces toward the third electrode 300. Accordingly, the first memory unit 400 and the second memory unit 500 become a state of a remnant polarization ($P_{r00}$), and the logic states of the first memory unit 400 and the second memory unit 500 may be "00".

When the voltage V applied to the second electrode 200 is $-V_{C2}<V<-V_{C1}$, the switching occurs in the first memory unit 400 and does not occur in the second memory unit 500. As a result, the dipole of the first memory unit 400 faces toward the second electrode 200, and the dipole of the second memory unit 500 faces toward the third electrode 300 as described above. Accordingly, the first memory unit 400 and the second memory unit 500 become a state of a remnant polarization ($P_{r10}$), and the logic states of the first memory unit 400 and the second memory unit 500 may be "10".

Referring to the above-mentioned description, it can be understood that when a positive voltage (+) is applied to the second electrode 200, the first memory unit 400 is switched prior to the second memory unit 500, and even when a negative voltage (−) is applied to the second electrode 200, the first memory unit 400 is also switched prior to the second memory unit 500. Here, the fact that the first memory unit 400 is switched prior to the second memory unit 500 is just an example for understanding and there is no limit to this. Therefore, in accordance with the structure and manufacturing method of the multi-bit memory device of the present invention, the second memory unit 500 may be switched prior to the first memory unit 400.

As such, in the multi-bit memory device of the present invention, the logic states of the first memory unit 400 and the second memory unit 500 may be repeated in the order of "11", "01", "00" and "10" depending on the voltage V applied to the second electrode 200.

Hereafter, the interference of the multi-bit memory device of the present invention will be described through the identification of the electric field distribution of the multi-bit memory device of the present invention.

Figure 4:
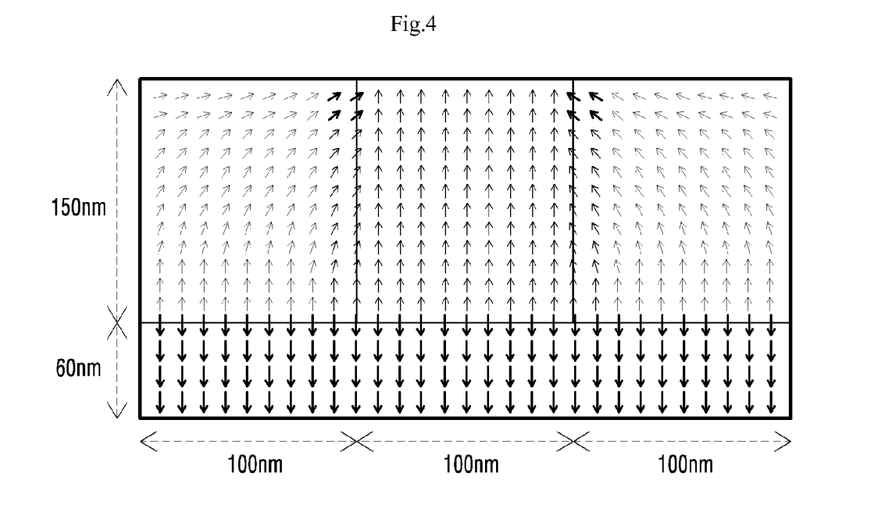
FIG. 4 is a view showing an electric field distribution of the multi-bit memory device of FIG. 1.

FIG. 4 is a view showing an electric field distribution of the multi-bit memory device of FIG. 1. Specifically, FIG. 4 shows an electric field distribution when 0V is applied to the first electrode 100 and the third electrode 300 and +8V is applied to the second electrode 200 (the logic state is "01"). Here, a coercive electric field is set to 0.75 MV/cm. A bold arrow area represents an area to which the electric field greater than the coercive electric field (Ec) is applied.

Referring to FIG. 4, it can be found that, in the first memory unit 400, the bold arrows are uniformly distributed in the area to which the electric field greater than the coercive electric field (Ec) is applied. It can be also found that the few bold arrows are included in the second memory unit 500. Accordingly, it can be seen that no interference occurs between two memories in the multi-bit memory device of the present invention.

As such, the multi-bit memory device of the present invention causes no interference, thereby outputting an accurate result value and thereby normally operating with its reduced size.

Hereafter, the multi-bit memory device according to the embodiment of the present invention will be described with reference to the accompanying drawings.

Hereafter, the same reference numerals will be assigned to the same components among the above-described components. Therefore, the descriptions of the same components will be omitted and other components different from the above-described components will be described.

First Embodiment

Figure 5:
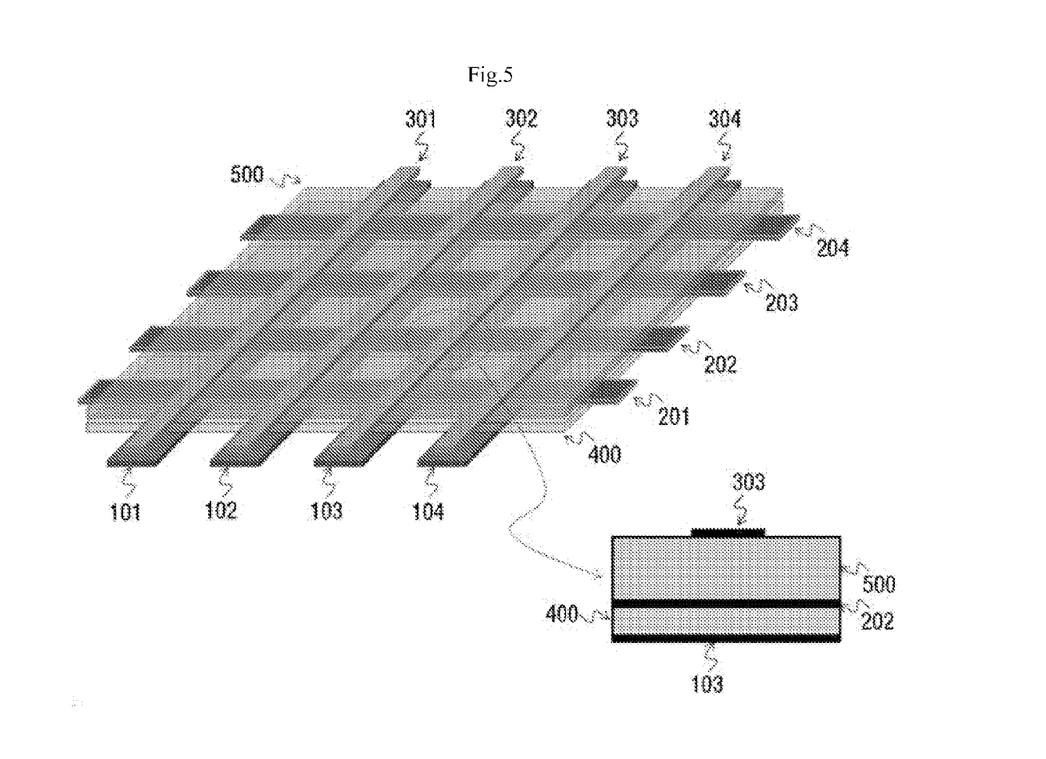
FIGS. 5 to 7 are perspective views for describing several examples of a multi-bit memory device according to a first embodiment.
Figure 6:
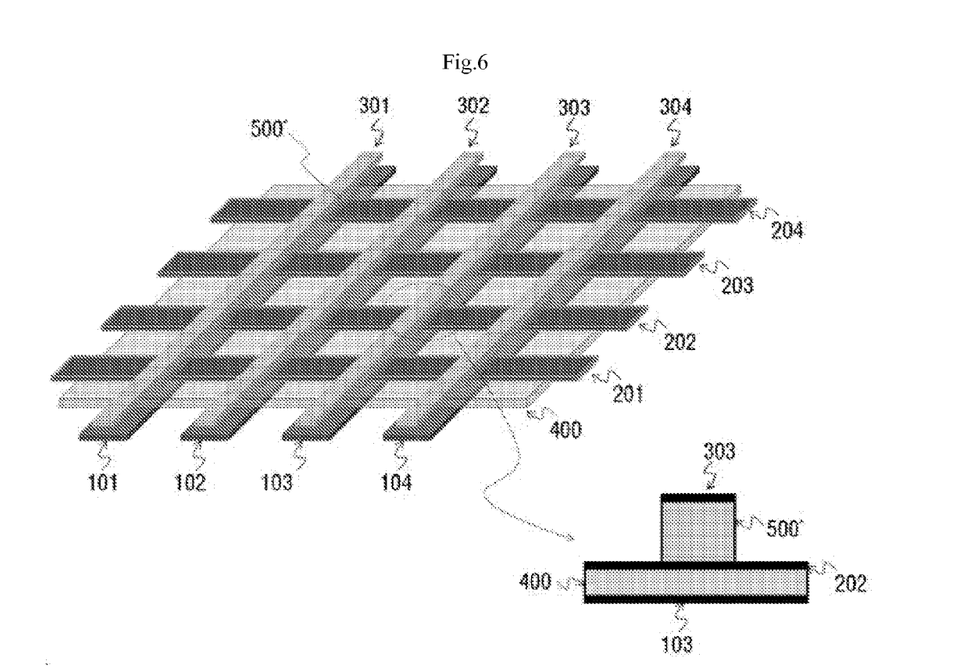
Figure 7:
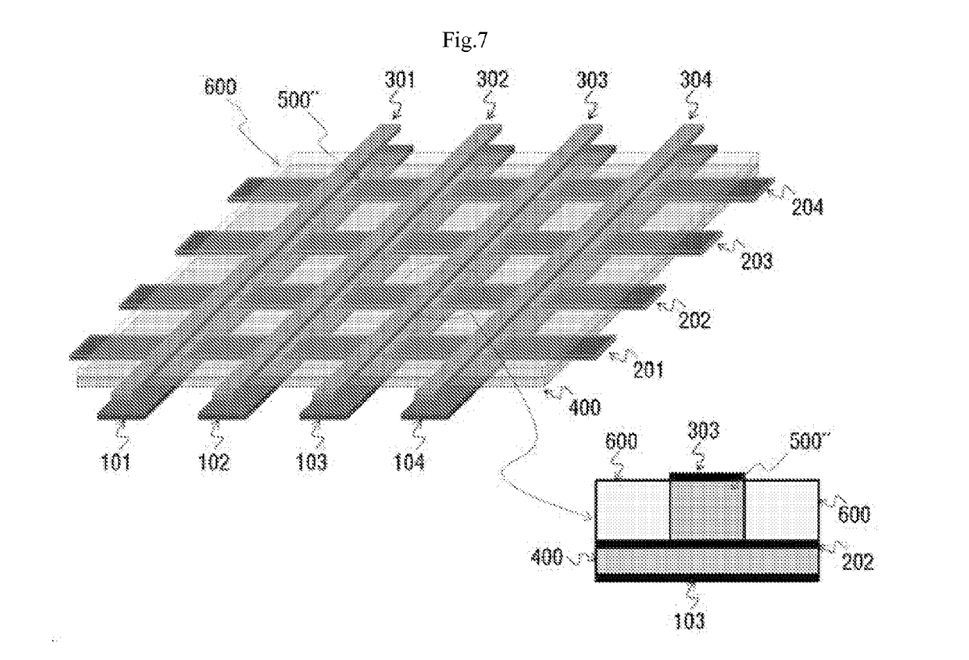

FIGS. 5 to 7 are perspective views of a multi-bit memory device according to a first embodiment. Specifically, the multi-bit memory device of FIG. 5 can be used as a passive matrix-addressable memory device. Also, FIG. 6 shows a modified example of FIG. 5. FIG. 7 shows a modified example of FIG. 6.

As shown in FIG. 5, the multi-bit memory device of FIG. 5 may include first electrode lines 101, 102, 103 and 104, second electrode lines 201, 202, 203 and 204, third electrode lines 301, 302, 303 and 304, the first memory unit 400 and the second memory unit 500.

The first electrode lines 101, 102, 103 and 104 may be the first electrode 100 of FIG. 1. The second electrode lines 201, 202, 203 and 204 may be the second electrode 200 of FIG. 1. The third electrode lines 301, 302, 303 and 304 may be the third electrode 300 of FIG. 1.

First, the multi-bit memory device according to the first embodiment will be described with reference to FIG. 5. The vertical lengths of the first electrode lines 101, 102, 103 and 104 are formed to be greater than the horizontal lengths thereof. The first electrode lines 101, 102, 103 and 104 may be disposed in parallel with each other.

The first memory unit 400 may be disposed on the first electrode lines 101, 102, 103 and 104 and may have a size sufficient to cover the entire first electrode lines 101, 102, 103 and 104.

The horizontal lengths of the second electrode lines 201, 202, 203 and 204 are formed to be greater than the vertical lengths thereof. The second electrode lines 201, 202, 203 and 204 may be parallel with each other and may be disposed on the first memory unit 400.

The second memory unit 500 may be disposed on the second electrode lines 201, 202, 203 and 204 and may have a size sufficient to cover the entire second electrode lines 201, 202, 203 and 204.

The vertical lengths of the third electrode lines 301, 302, 303 and 304 are formed to be greater than the horizontal lengths thereof. The third electrode lines 301, 302, 303 and 304 may be parallel with each other and may be disposed on the second memory unit 500.

The first electrode lines 101, 102, 103 and 104 and the third electrode lines 301, 302, 303 and 304 may be electrically connected to each other by a device capable of applying the same electrical signal.

Referring to the cross sectional view shown on the bottom right of FIG. 5, it can be seen that an intersection point of the first electrode line 103, the second electrode line 201 and the third electrode line 303 has a shape similar to that of the multi-bit memory device of FIG. 1. Therefore, the intersection points of the first electrode lines 101, 102, 103 and 104, the second electrode lines 201, 202, 203 and 204 and the third electrode lines 301, 302, 303 and 304 may have the same shape and the same characteristics as those of the foregoing multi-bit memory device of FIG. 1.

FIG. 6 shows a modified example of FIG. 5. Specifically, FIG. 6 shows a modified example of the second memory unit 500 of FIG. 5. Hereafter, the following description will focus on a second memory unit 500'.

As shown in FIG. 6, the second memory unit 500' may include a plurality of memory units. The plurality of memory units may be disposed respectively at the intersection points of the first electrode lines 101, 102, 103 and 104, the second electrode lines 201, 202, 203 and 204 and the third electrode lines 301, 302, 303 and 304. Here, the second memory unit 500' of FIG. 6 may be obtained by etching or patterning the second memory unit 500 of FIG. 5.

The horizontal length of the second memory unit 500' may be similar to the horizontal lengths of the third electrode lines 301, 302, 303 and 304. When the horizontal length of the second memory unit 500' is similar to the horizontal lengths of the third electrode lines 301, 302, 303 and 304, a more accurate memory operation than that of the multi-bit memory device can be realized. Accordingly, the multi-bit memory device of FIG. 6 is able to perform a more accurate memory operation than that of the multi-bit memory device of FIG. 5.

FIG. 7 shows a modified example of FIG. 6. Specifically, FIG. 7 shows the example of FIG. 6 with the addition of the low dielectric material 600. Hereafter, the following description will focus on the low dielectric material 600.

As shown in FIG. 7, the multi-bit memory device of FIG. 7 may further include the low dielectric material 600 disposed between the second memory units 500' of FIG. 6. The low dielectric material 600 may correspond to the low dielectric material described in FIG. 1. When the low dielectric material 600 is disposed between the plurality of the memory units, the structure of a second memory unit 500" may be more stable than those of the second memory units 500 and 500' of FIGS. 5 and 6. Further, the stable structure of the second memory units 500" allows the multi-bit memory device of FIG. 7 to be stably operated.

As such, the multi-bit memory device of FIG. 5 according to the first embodiment has a high degree of integration thanks to the arrangement of the plurality of the memory devices causing no interference. Also, as shown in FIGS. 6 and 7, the multi-bit memory device is able to stably perform an accurate memory operation by modifying the shape of the second memory unit.

Second Embodiment

Figure 8:
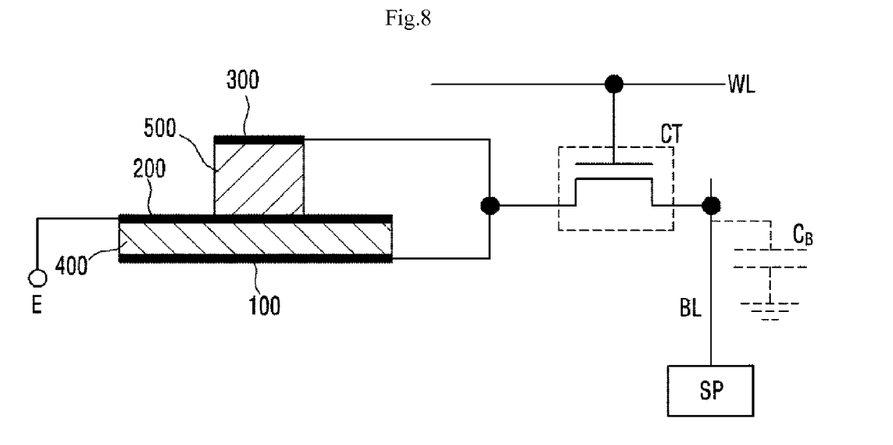
FIG. 8 is a conceptual view of a multi-bit memory device according to a second embodiment.

FIG. 8 is a conceptual view of a multi-bit memory device according to a second embodiment. Specifically, the multi-bit memory device of FIG. 8 is comprised of one transistor-one capacitor.

As shown in FIG. 8, the multi-bit memory device according to the second embodiment may include the first electrode 100, the second electrode 200, the third electrode 300, the first memory unit 400, the second memory unit 500, a cell transistor (CT) and a signal processor (SP).

The second electrode 200 may be electrically connected to an electrode line E.

The cell transistor (CT) may include a source, a drain and a gate. The source is electrically connected to the first electrode 100 and the third electrode 300. The drain is electrically connected to a bit line (BL). The gate is electrically connected to a word line (WL). The gate is opened and closed by the word line (WL) connected thereto. Here, the connections of the source and the drain are not limited to this. The source may be connected to the bit line (BL), and the drain may be connected to the first electrode 100 and the third electrode 300.

The signal processor (SP) may be electrically connected to the bit line (BL) and may be electrically connected to the cell transistor (CT) by using the bit line (BL). The signal processor (SP) may include a comparator (CP, not shown) and a multiplexer (MUX, not shown).

When a voltage is applied to the electrode line E, an electrical signal is applied to the word line (WL) and then the cell transistor (CT) is operated. When the first electrode 100 and the third electrode 300 are connected to the bit line (BL), the electric potential of the bit line (BL) changes by electric charge distribution in accordance with the quantity of the electric charges stored in the first memory unit 400 and the second memory unit 500. Here, the comparator (CP) of the signal processor (SP) connected to the bit line (BL) compares the electric potential with an initial electric potential of the bit line (BL) and outputs a comparison signal to the multiplexer (MUX). Then, the multiplexer (MUX) determines the logic states of the first memory unit 400 and the second memory unit 500 through the inputted comparison signal. Here, the comparison signal represents a difference value between the initial electric potential and the changed electric potential of the bit line (BL). Accordingly, the multi-bit memory device according to the second embodiment is able to determine and control the data of each of the memory devices including the comparator (CP) and the signal processor (SP).

Here, the quantity of the electric charges transferred from the first memory unit 400 may be different from the quantity of the electric charges transferred from the second memory unit 500. Therefore, the multi-bit memory device according to the second embodiment may have four logic states.

As such, the multi-bit memory device according to the second embodiment causes no interference and can control each of the memory devices.

Third Embodiment

Figure 9:
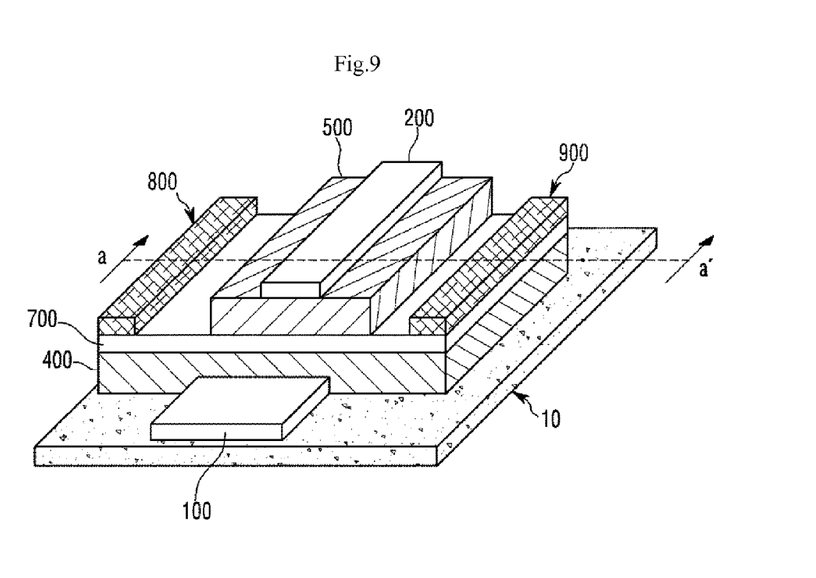
FIG. 9 is a perspective view of a multi-bit memory device according to a third embodiment.
Figure 10:
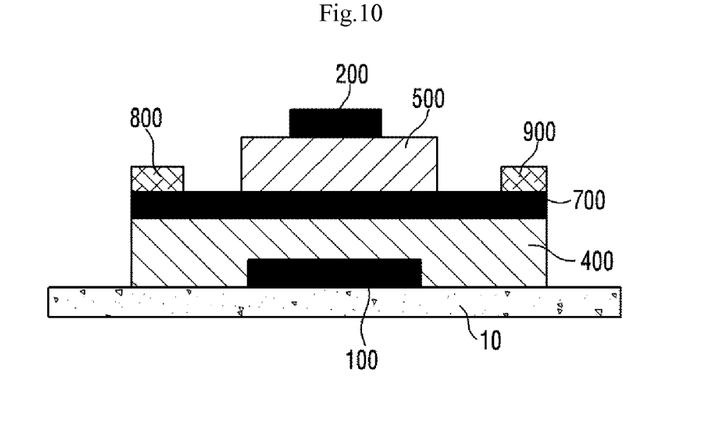
FIG. 10 is a cross sectional view of the multi-bit memory device shown in FIG. 9 taken along line a-a'.

FIG. 9 is a perspective view of a multi-bit memory device according to a third embodiment. FIG. 10 is a cross sectional view of the multi-bit memory device shown in FIG. 9 taken along line a-a'. Specifically, the multi-bit memory device of FIG. 9 is comprised of one transistor.

As shown in FIGS. 9 and 10, the multi-bit memory device according to the third embodiment may include a substrate 10, the first electrode 100, the second electrode 200, the first memory unit 400, the second memory unit 500, a semiconductor unit 700, a source electrode 800 and a drain electrode 900.

First, the structure of the multi-bit memory device according to the third embodiment will be described. The first electrode 100 is disposed on the substrate 10. The first memory unit 400 is disposed on the first electrode 100 and the substrate 10. The semiconductor unit 700 is disposed on the first memory unit 400. The source electrode 800 is disposed on one side of the semiconductor unit 700. The drain electrode 900 is disposed on the other side of the semiconductor unit 700 and is spaced apart from the source electrode 800. The second memory unit 500 is located between the source electrode 800 and the drain electrode 900 and is disposed on the semiconductor unit 700. The second electrode 200 is disposed on the second memory unit 500.

The substrate 10 may include a silicon wafer, glass, plastic, paper, metal foil and the like.

The semiconductor unit 700 may include silicone, GaAs compound, Ge, organic semiconductor materials. The semiconductor unit 700 may also include at least one of carbon nanotube and its derivative, fullerene and its derivative, and graphene and its derivative.

The semiconductor unit 700 may be disposed by a spin coating method, a spray method, a printing method, an ink jet method, Langmuir-Blodgett method, an evaporation method, a sputtering method, an atomic layer deposition (ALD) method, and a transferring method.

Figure 11:
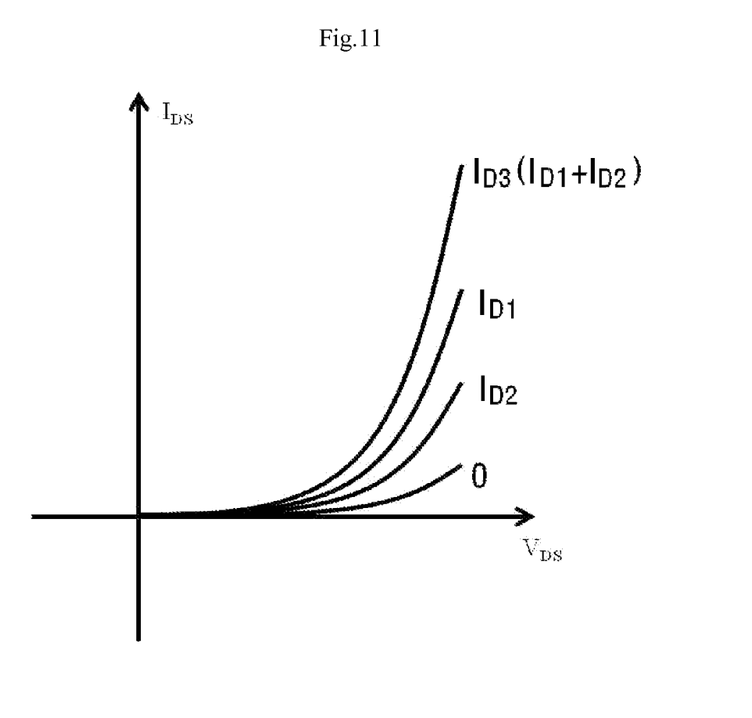
FIG. 11 is a current-voltage graph of the multi-bit memory device shown in FIG. 10.

FIG. 11 is a current-voltage graph of the multi-bit memory device shown in FIG. 10. Specifically, the horizontal axis of FIG. 11 represents a voltage applied between the source electrode and the drain electrode. The vertical axis of the FIG. 11 represents a current applied between the source electrode and the drain electrode.

Referring to FIGS. 10 and 11, the first memory unit 400 and the second memory unit 500 are controlled by the first electrode 100 and the second electrode 200. Specifically, the polarization direction of the first memory unit 400 is changed by applying a first operating voltage to the first electrode 100. Also, the polarization direction of the second memory unit 500 is changed by applying a second operating voltage to the second electrode 200. Here, the first operating voltage may or may not be equal to the second operating voltage.

The current may flow through the semiconductor unit 700. Here, the current may flow from the source electrode 800 to the drain electrode 900. The current flowing through the semiconductor unit 700 may be one value of 0, $I_{D1}$, $I_{D2}$, and $I_{D3}$ (i.e., $I_{D1}+I_{D2}$). Here, the values of 0, $I_{D1}$, $I_{D2}$, and $I_{D3}$ may be set such that $I_{D3}>I_{D1}>I_{D2}>0$. Here, although it is described that $I_{D1}$ is greater than $I_{D2}$ for better understanding, $I_{D2}$ is greater than $I_{D1}$ without being limited to this.

Specifically, when the first operating voltage is not applied to the first electrode 100 and the second operating voltage is not applied to the second electrode 200, the value of the current flowing through the semiconductor unit 700 is 0.

When the first operating voltage is not applied to the first electrode 100 and the second operating voltage is applied to the second electrode 200, the value of the current flowing through the semiconductor unit 700 is $I_{D2}$.

When the first operating voltage is applied to the first electrode 100 and the second operating voltage is not applied to the second electrode 200, the value of the current flowing through the semiconductor unit 700 is $I_{D1}$.

When the first operating voltage is applied to the first electrode 100 and the second operating voltage is applied to the second electrode 200, the value of the current flowing through the semiconductor unit 700 is $I_{D3}$.

As such, the multi-bit memory device according to the third embodiment causes no interference. Also, as shown in FIG. 11, the multi-bit memory device according to the third embodiment is able to store the four logic states 0, $I_{D1}$, $I_{D2}$, and $I_{D3}$.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-bit memory device, comprising:
   a first electrode;
   a third electrode disposed apart from the first electrode;
   a second electrode disposed between the first electrode and the third electrode;
   a first memory unit disposed between the first electrode and the second electrode and including a material which is electrically polarized and exhibits hysteresis;
   a second memory unit disposed between the second electrode and the third electrode and including a material which is electrically polarized and exhibits hysteresis; and
   a low dielectric material disposed on the second electrode in an area in which the second memory unit is not disposed.

2. The multi-bit memory device of claim 1, further comprising:
   a cell transistor which includes a source, a drain and a gate;
   a word line which is electrically connected to the gate;
   a bit line which is electrically connected to the drain; and
   a signal processor which is electrically connected to the bit line and includes a comparator and a multiplexer,
   wherein the source is electrically connected to the first electrode and the third electrode,
   wherein, when an operating voltage is applied to the second electrode, the cell transistor is operated,
   wherein, when the first electrode and the third electrode are connected to the bit line, an electric potential of the bit line changes,
   wherein the comparator compares the electric potential with an initial electric potential of the bit line and outputs a comparison signal to the multiplexer, and
   wherein the multiplexer determines logic states of the first memory unit and the second memory unit through the comparison signal.

3. A multi-bit memory device, comprising:
   at least two first electrode lines which are parallel with each other;
   at least two second electrode lines which are parallel with each other and are disposed to intersect the first electrode lines;
   at least two third electrode lines which are parallel with the first electrode lines and are disposed to intersect the second electrode lines;

a first memory unit disposed between the first electrode lines and the second electrode lines and including a material which is electrically polarized and exhibits hysteresis;

a second memory unit disposed between the second electrode lines and the third electrode lines and including a material which is electrically polarized and exhibits hysteresis; and a low dielectric material disposed on the second electrode lines in an area in which the second memory unit is not disposed.

4. The multi-bit memory device of claim 3, wherein the second memory unit comprises a plurality of memory units each of which is disposed at an intersection point of the first electrode lines, the second electrode lines and the third electrode lines.

5. The multi-bit memory device of claim 4, wherein:
the low dielectric material is filled between the plurality of the memory units, and
the low dielectric material has a dielectric constant less than dielectric constants of the first memory unit and the second memory unit.

6. The multi-bit memory device of claim 1, wherein the first memory unit is switched prior to the second memory unit.

7. A multi-bit memory device comprising:
a substrate;
a first electrode which is disposed on the substrate;
a first memory unit which is disposed on the substrate and the first electrode and includes a material which is electrically polarized and exhibits hysteresis;
a semiconductor unit which is disposed on the first memory unit;
a source electrode which is disposed on one side of the semiconductor unit;
a drain electrode which is disposed on the other side of the semiconductor unit;
a second memory unit which is disposed on the semiconductor unit and is located between the source electrode and the drain electrode and includes a material which is electrically polarized and exhibits hysteresis; and
a second electrode which is disposed on the second memory unit.

8. The multi-bit memory device of claim 7,
wherein, when a first operating voltage is applied to the first electrode and a second operating voltage is not applied to the second electrode, a first current flows through the semiconductor unit,
wherein, when the first operating voltage is not applied to the first electrode and the second operating voltage is applied to the second electrode, a second current flows through the semiconductor unit, and
wherein the first current is greater than the second current.

9. The multi-bit memory device of claim 1, wherein the first memory unit and the second memory unit comprise ferroelectrics or an electret material.

10. The multi-bit memory device of claim 1, wherein an area of the first memory unit is different from an area of the second memory unit.

11. The multi-bit memory device of claim 3, wherein the first memory unit is switched prior to the second memory unit.

12. The multi-bit memory device of claim 3, wherein the first memory unit and the second memory unit comprise ferroelectrics or an electret material.

13. The multi-bit memory device of claim 3, wherein an area of the first memory unit is different from an area of the second memory unit.

14. The multi-bit memory device of claim 7, wherein the first memory unit and the second memory unit comprise ferroelectrics or an electret material.

15. The multi-bit memory device of claim 7, wherein an area of the first memory unit is different from an area of the second memory unit.

16. The multi-bit memory device of claim 1, wherein the low dielectric material is in contact with side surfaces of the second memory unit.

17. The multi-bit memory device of claim 1, wherein the low dielectric material has the same thickness as a thickness of the second memory unit.

18. The multi-bit memory device of claim 3, wherein the low dielectric material is in contact with side surfaces of the second memory unit.

19. The multi-bit memory device of claim 3, wherein the low dielectric material has the same thickness as a thickness of the second memory unit.

* * * * *